US009470744B2

(12) United States Patent
Buhmann et al.

(10) Patent No.: US 9,470,744 B2
(45) Date of Patent: Oct. 18, 2016

(54) ANALYSIS CIRCUIT FOR FIELD EFFECT TRANSISTORS HAVING A DISPLACEABLE GATE STRUCTURE

(75) Inventors: Alexander Buhmann, Reutlingen (DE); Fabian Henrici, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 389 days.

(21) Appl. No.: 14/116,498

(22) PCT Filed: Mar. 12, 2012

(86) PCT No.: PCT/EP2012/054188
§ 371 (c)(1),
(2), (4) Date: Feb. 28, 2014

(87) PCT Pub. No.: WO2012/152468
PCT Pub. Date: Nov. 15, 2012

(65) Prior Publication Data
US 2014/0165725 A1    Jun. 19, 2014

(30) Foreign Application Priority Data

May 10, 2011    (DE) .......... 10 2011 075 541

(51) Int. Cl.
G01P 15/12    (2006.01)
G01R 31/26    (2014.01)
G01D 3/032    (2006.01)

(52) U.S. Cl.
CPC ......... *G01R 31/2621* (2013.01); *G01P 15/124* (2013.01); *G01D 3/032* (2013.01)

(58) Field of Classification Search
CPC .... G01P 15/124; G01P 15/18; G01P 15/125; G01C 19/5726
USPC ............. 73/514.33, 514.34, 514.32; 324/661
See application file for complete search history.

(56) References Cited

U.S. PATENT DOCUMENTS

| 5,103,279 | A |   | 4/1992 | Gutteridge |
| 5,279,162 | A |   | 1/1994 | Takebe et al. |
| 5,323,115 | A | * | 6/1994 | Werner, Jr. ............... G01R 1/30 324/452 |
| 5,397,911 | A |   | 3/1995 | Hiyama et al. |
| 5,541,437 | A | * | 7/1996 | Watanabe ............ G01P 15/124 257/417 |
| 8,461,833 | B2 | * | 6/2013 | Classen ................ B81C 99/003 324/200 |
| 8,618,816 | B2 | * | 12/2013 | He ..................... G01C 19/5726 324/661 |

(Continued)

FOREIGN PATENT DOCUMENTS

DE    195 09 338 A1    9/1995
EP    0 570 148 A2    11/1993

(Continued)

OTHER PUBLICATIONS

International Search Report corresponding to PCT Application No. PCT/EP2012/054188, mailed May 30, 2012 (German and English language document) (7 pages).

*Primary Examiner* — Helen Kwok
(74) *Attorney, Agent, or Firm* — Maginot, Moore & Beck LLP

(57) ABSTRACT

An analysis circuit for a field effect transistor having a displaceable gate structure, includes a measurement circuit coupled between a supply voltage connection of the analysis circuit and a drain connection of the field effect transistor and configured to output a measurement signal that is dependent on the current strength of a current flowing through the field effect transistor to a measurement connection.

8 Claims, 7 Drawing Sheets

(56) References Cited

U.S. PATENT DOCUMENTS

2002/0005530 A1  1/2002  Heyers et al.
2010/0007326 A1  1/2010  Nakazato

FOREIGN PATENT DOCUMENTS

EP    0990911 A1    4/2000
WO   2010/124889 A2  11/2010

* cited by examiner

ANALYSIS CIRCUIT FOR FIELD EFFECT TRANSISTORS HAVING A DISPLACEABLE GATE STRUCTURE

This application is a 35 U.S.C. §371 National Stage Application of PCT/EP2012/054188, filed on Mar. 12, 2012, which claims the benefit of priority to Ser. No. DE 10 2011 075 541.1, filed on May 10, 2011 in Germany, the disclosures of which are incorporated herein by reference in their entirety.

The disclosure relates to an analysis circuit for a field effect transistor having a movable gate structure, in particular for field effect transistors used as micromechanical sensors.

BACKGROUND

Field effect transistors having a movable gate structure, so-called "Moving Gate"-FETs, are suitable for detecting small movements. They generally have a very good signal-to-noise ratio and can therefore be used, for example, as acceleration sensors in miniaturized sensor cores in the field of inertial sensor technology.

Field effect transistors having a movable gate structure have a substrate, in which an n-doped or p-doped channel is introduced between a drain region and a source region. An insulation layer is applied above the channel region, a gate structure in turn being arranged above said insulation layer. In this case, the gate structure is configured in a movable fashion, that is to say that an external force acting on the gate structure can deflect the gate structure in a direction perpendicular to the substrate surface and/or in a direction in the plane of the substrate surface. As a result of this deflection, when a gate voltage is present at the gate structure, the charge carrier density in the channel region changes, which in turn leads to a change in resistance between drain region and source region. This change is resistance can be measured, either by applying a constant gate voltage to the gate structure, keeping the drain-source voltage constant and measuring the current flowing through the field effect transistor or the change in current intensity caused by the deflection, or by impressing a constant current into the field effect transistor and measuring the change in the drain-source voltage on account of the deflection.

The document US 2002/0005530 A1 discloses a field effect transistor having a flexibly mounted gate electrode above a planar substrate, wherein an acceleration of the field effect transistor results in a deflection of the gate electrode relative to the substrate, as a result of which a change in the current intensity in a channel region of the field effect transistor becomes measurable.

The document EP 0 990 911 A1 discloses a micromechanical sensor on the basis of a field effect transistor having a movable gate, the deflections of which bring about a variation of the channel region of the field effect transistor that is overlapped by the gate.

The document WO 2010/124889 A2 discloses an analysis circuit for a field effect transistor having a movable gate, said transistor being connected in series with a reference transistor. A nonlinear measurement signal of the movable gate can be tapped off at an intermediate node between the two field effect transistors.

SUMMARY

The present disclosure therefore provides an analysis circuit for a transistor having a movable gate structure, comprising a measuring circuit, which is coupled between a supply voltage terminal of the analysis circuit and a drain terminal of the transistor and which is designed to output a measurement signal at a measurement terminal, said measurement signal being dependent on the current intensity of a current flowing through the transistor.

In accordance with a further embodiment, the disclosure provides a micromechanical sensor, in particular an acceleration sensor, comprising a field effect transistor having a movable gate structure, comprising a source terminal, which is coupled to a reference potential, a drain terminal and a gate terminal, to which a constant gate voltage is applied; and an analysis circuit according to the disclosure, which is coupled to the drain terminal of the field effect transistor and which is designed to output a first measurement signal at the measurement terminal, said first measurement signal being dependent on the current intensity of a current flowing through the field effect transistor.

A fundamental concept of the disclosure is to specify an analysis circuit for a field effect transistor having a movable gate in which, firstly, the basic current, which is higher by orders of magnitude, no longer has to be concomitantly amplified and in which, secondly, the differential output resistance of the field effect transistor is increased. Both effects contribute to a considerable increase in the signal-to-noise ratio of the measurement signal of the analysis circuit, as a result of which the analysis circuit only has to be designed for a smaller dynamic range.

Surface charges can accumulate on the insulation layer of field effect transistors and additionally influence the charge carrier density in the channel region. Corruption of the charge carrier density, which is variable depending on the deflections of the gate structure, can advantageously be eliminated with the analysis circuit, even for surface charges that can occur as early as during the manufacture of the individual field effect transistors having a movable gate structure or else during the lifetime and period of use of the field effect transistor. Moreover, fluctuations in the surface charges depending on the ambient temperature or other ambient parameters can be compensated for by the analysis circuit according to the disclosure.

Such an analysis circuit makes it possible to minimize a variation of the operating point of the field effect transistor. It is true that fluctuations in the basic current that are caused by surface charges lie in the microamperes range, while the current intensity changes to be measured vary in the pico- to nanoamperes range—however, since the occurrence of offset currents that are very high in comparison with the actual measurement signal can be effectively prevented in the analysis circuit, the analysis circuit can advantageously be designed for a limited dynamic range. This considerably facilitates the amplification of the actual measurement signal to a desired signal level of approximately 60 to 80 dB, since offset currents that could very easily lead to an overload of the analysis circuit do not have to be concomitantly amplified at the same time.

In one preferred embodiment, the analysis circuit comprises an impedance converter circuit having a reference voltage terminal, said impedance converter circuit being coupled between the measuring circuit and the drain terminal of the field effect transistor and being designed to hold the drain terminal of the field effect transistor at the potential of a reference voltage applied to the reference voltage terminal. This can preferably be effected by means of a source follower transistor, which is coupled between the measuring circuit and the drain terminal of the field effect transistor, and an operation amplifier. This gives rise to the advantage that the source-drain voltage of the field effect transistor is kept constant and the effective differential output resistance of the field effect transistor increases as a result. A considerable increase in the signal swing can thus be achieved particularly in the linear measurement range. In addition, the sensitivity of the field effect transistor can advantageously be deduced from the change in the output current by means of a variation of the reference voltage.

In one preferred embodiment, the analysis circuit comprises an offset correction circuit having an offset signal feed terminal, said offset correction circuit being coupled between the supply voltage terminal and the drain terminal of the field effect transistor and being designed to compensate for a basic current occurring at the drain terminal of the field effect transistor by means of an offset correction signal fed in at the offset signal feed terminal. This is advantageously achieved by means of a current source circuit having a very high output resistance, for example a current mirror circuit or a cascode circuit having two input terminals, which are in each case connected to the supply voltage terminal, a first output terminal, which is coupled to the drain terminal of the field effect transistor, and a second output terminal, which is coupled to the offset signal feed terminal. This affords the advantage that the actual measurement signal can be amplified considerably better, without having to concomitantly amplify the basic current. As a result, the dynamic range of the analysis circuit becomes independent of the basic current. In particular, the variations as a result of fluctuating surface charges in the channel region of the field effect transistor no longer have to be concomitantly amplified by the analysis circuit, as a result of which an overload of the analysis circuit no longer occurs.

Further features and advantages of embodiments of the disclosure will become apparent from the following description with reference to the accompanying drawings.

DETAILED DESCRIPTION

Figure 1:
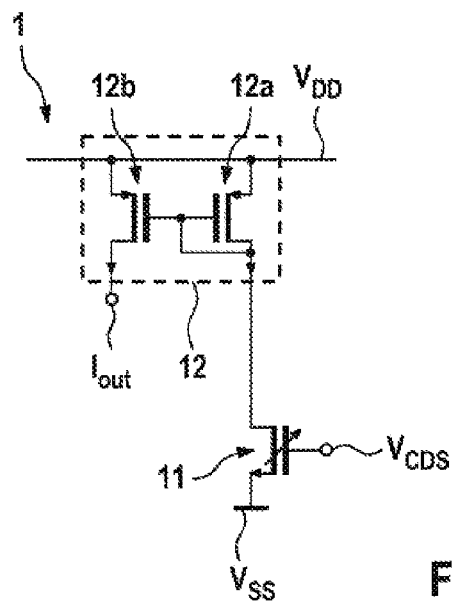
FIGS. 1 to 5 show schematic illustrations of analysis circuits for a field effect transistor having a movable gate structure in accordance with embodiments of the disclosure.

FIG. 1 shows the schematic illustration of an analysis circuit 1 for field effect transistor (FET) 11 having a movable gate structure. The FET 11 can be an n-channel MOSFET for example. The FET 11 has a source terminal, which is connected to a reference potential $V_{SS}$, for example a ground potential. The FET 11 furthermore has a gate terminal, to which a gate voltage $V_{CDS}$ can be applied. In this case, the gate voltage $V_{CDS}$ can be a constant voltage, for example. The FET 11 additionally has a drain terminal, which is coupled to a measuring circuit 12. It is clear to a person skilled in the art that a p-channel MOSFET can likewise be used for the FET 11, wherein the source and drain terminals are connected accordingly. Furthermore, a bulk terminal (not shown) can also be provided for the FET 11 in order to counteract production-dictated variations in the channel region of the FET 11.

The measuring circuit 12 is designed to measure a current intensity of a current that flows through the channel region of the FET 11, and to provide it at a signal output. By way of example, the measuring circuit 12 comprises a current mirror circuit composed of two transistors 12a and 12b, which are in each case coupled via their input terminals to a supply voltage terminal $V_{DD}$ of the analysis circuit 1. An output terminal of a transistor 12a is coupled to the drain terminal of the FET 11. An output terminal of a transistor 12b is coupled to the signal output of the measuring circuit 12. The current intensity that flows through the channel region of the FET 11 flows through the transistor 12a of the current mirror circuit. The current mirror circuit mirrors the current flowing through the transistor 12a onto the transistor 12b, such that a current intensity signal $I_{out}$ that is proportional to the current intensity of the current flowing through the FET 11 is output at the signal output of the measuring circuit 12. In this case, the transistors 12a and 12b can be dimensioned accordingly so that the current intensity signal $I_{out}$ is a multiple of the current intensity of the current flowing through the FET 11, for example one to ten thousand times said current intensity. In one preferred variant, the amplification factor can be 10 to 1000. In this case, the amplification of the current mirror circuit represents an amplification of the current intensity signal $I_{out}$ at a first stage, and it goes without saying that the current intensity signal $I_{out}$ can be amplified further in further stages of the processing.

Figure 2:
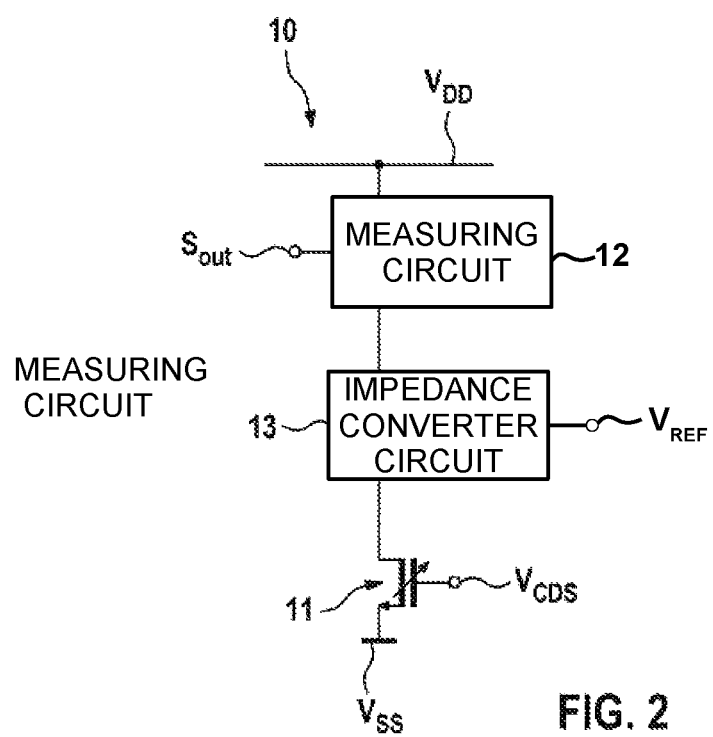
Figure 3:
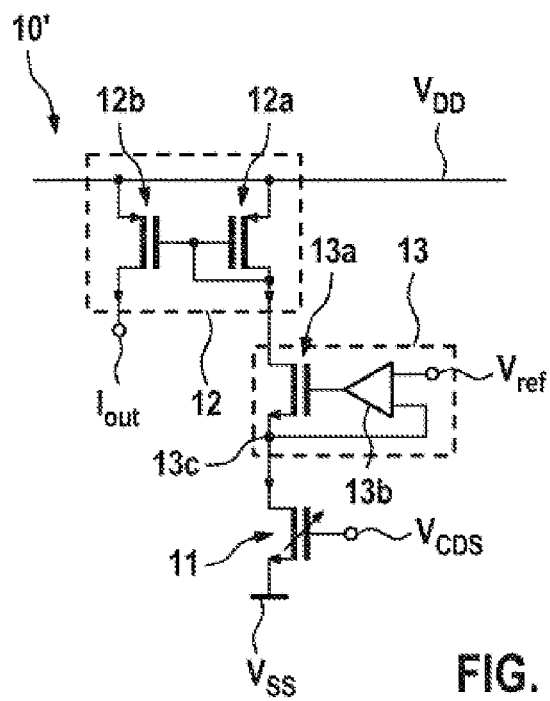
Figure 4:
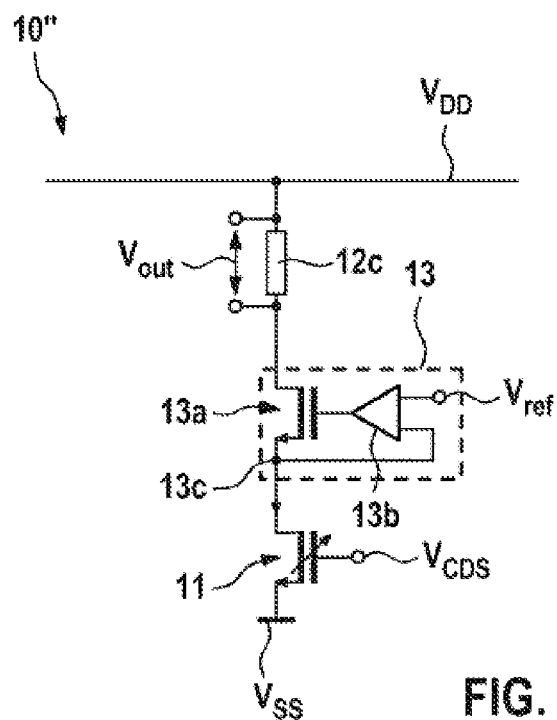
Figure 5:
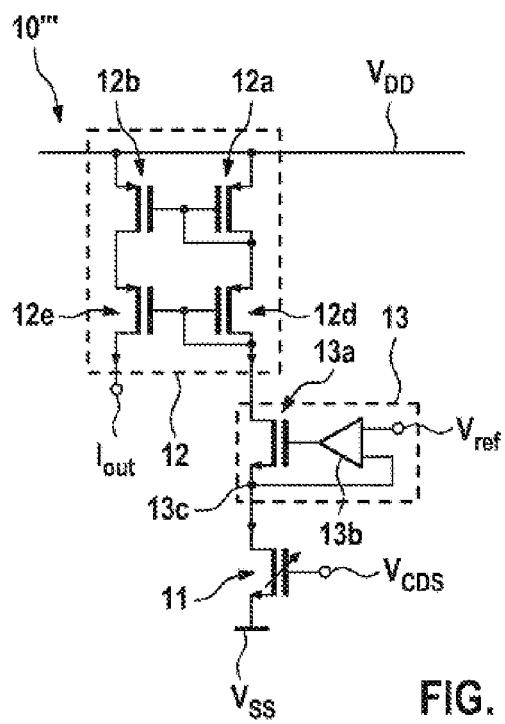

FIG. 2 shows a schematic illustration of an analysis circuit 10 for a field effect transistor (FET) 11 having a movable gate structure. The analysis circuit 10 comprises a FET 11, a measuring circuit 12 having a measurement terminal $S_{out}$, and an impedance converter circuit 13 having a reference voltage terminal $V_{ref}$ which is designed to increase the differential output impedance of the FET 11. FIGS. 3 to 5 show exemplary embodiments of the analysis circuit 10 shown in FIG. 2.

FIG. 3 shows a schematic illustration of an analysis circuit 10' for a field effect transistor (FET) 11 having a movable gate structure. The analysis circuit 10' differs from the analysis circuit 1 in that an impedance converter circuit 13 is coupled between the drain terminal 13c of the FET 11 and the measuring circuit 12. The impedance converter circuit 13 can comprise a source follower transistor 13a, for example, which is coupled between the drain terminal 13c of the FET 11 and the measuring circuit 12. Furthermore, the impedance converter circuit 13 can comprise an operational amplifier 13b having an output terminal, which is coupled to a gate terminal of the source follower transistor 13a, an inverting input terminal, which is coupled to the drain terminal 13c of the field effect transistor 11, and a non-inverting input terminal, which is coupled to the reference voltage terminal $V_{ref}$. The operational amplifier 13b, with the aid of the source follower transistor 13a, holds the drain terminal 13c of the FET 11 at a constant potential, which is determined by a preferably constant reference voltage at the reference voltage terminal $V_{ref}$. The source follower transistor 13a is illustrated as an n-channel MOSFET in FIG. 3. However, it is clear that a p-channel MOSFET can likewise be used as source follower transistor 13a. The latter then acts like a variable resistor.

FIG. 4 shows a schematic illustration of an analysis circuit 10" for a field effect transistor (FET) 11 having a movable gate structure. The analysis circuit 10" differs from the analysis circuit 10' in that the measuring circuit 12 comprises a shunt resistor 12c, at which a voltage signal $V_{out}$ can be tapped off, said voltage signal being dependent on the current intensity of the current flowing through the shunt resistor 12c.

FIG. 5 shows a schematic illustration of an analysis circuit 10''' for a field effect transistor (FET) 11 having a movable gate structure. The analysis circuit 10''' differs from the analysis circuit 10" in that the measuring circuit 12 comprises a cascode circuit composed of four transistors 12a, 12b, 12d and 12e. In this case, the cascode circuit can be a serial interconnection of two current mirror circuits as shown in FIG. 1. The use of a cascode circuit makes it possible to improve the linearity of the measurement signal and the amplification of the analysis circuit by comparison with a simple current mirror circuit. Alternatively, instead of a cascode circuit, it is also possible to use an active current mirror circuit for the measuring circuit 12.

Figure 6:
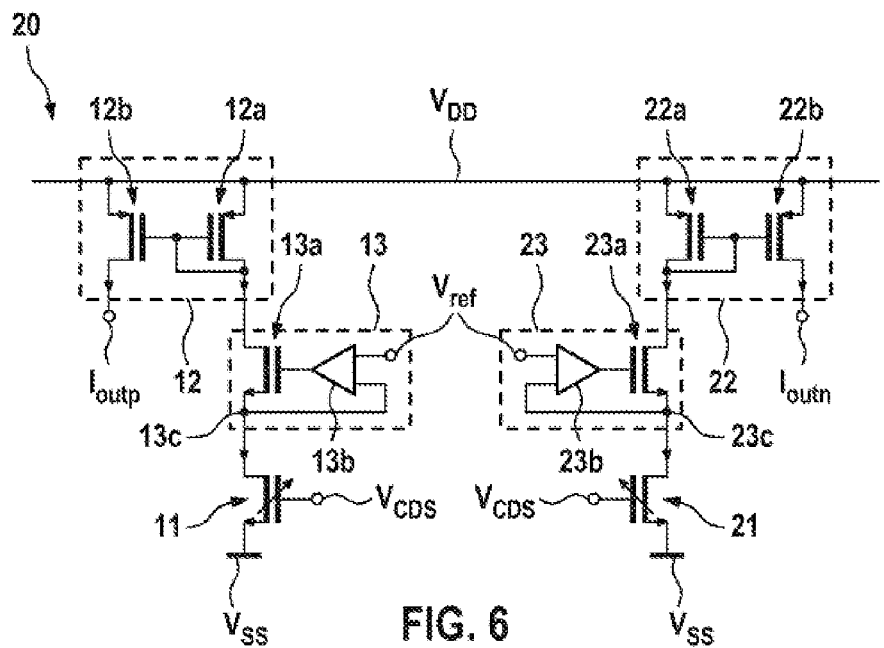
FIG. 6 shows a schematic illustration of pseudo-differential analysis circuit for two field effect transistors having a movable gate structure in accordance with a further embodiment of the disclosure.

FIG. 6 shows a schematic illustration of an analysis circuit 20 for two field effect transistors (FET) 11 and 21 each having a movable gate structure. The analysis circuit 20 is a pseudo-differential analysis circuit composed of two analysis circuits 10' such as are shown in FIG. 3 and have been explained. In this case, the measuring and impedance converter circuits of one analysis path, said circuits being designated by the reference signs 23 and 22, correspond to the measuring and impedance converter circuits of the other analysis path, said circuits being designated by the reference signs 13 and 12. In this case, the movable gate structures of the FETs 11 and 21 can be arranged in such a way that the movable gate structures move in opposite directions under the influence of an external force, for example an external acceleration, such that common-mode interference signals, for example as a result of the supply voltage, can be suppressed. In this case, current intensity signals $I_{outp}$ and $T_{outn}$ can be read out at the two output terminals of the measuring circuits 12 and 22, the difference between which signals can correspond to the measurement signal.

By means of the pseudo-differential design of the analysis circuit 20, a digitization of the measurement signal can be simplified and changes in the basic current, for example as a result of changes in the surface charges in the channel regions of the FETs 11 and 21 as a result of ageing influences and/or temperature influences, can be determined and compensated for since such influences are manifested only in common-mode signals and can thus be distinguished from the differential measurement signal.

Figure 7:
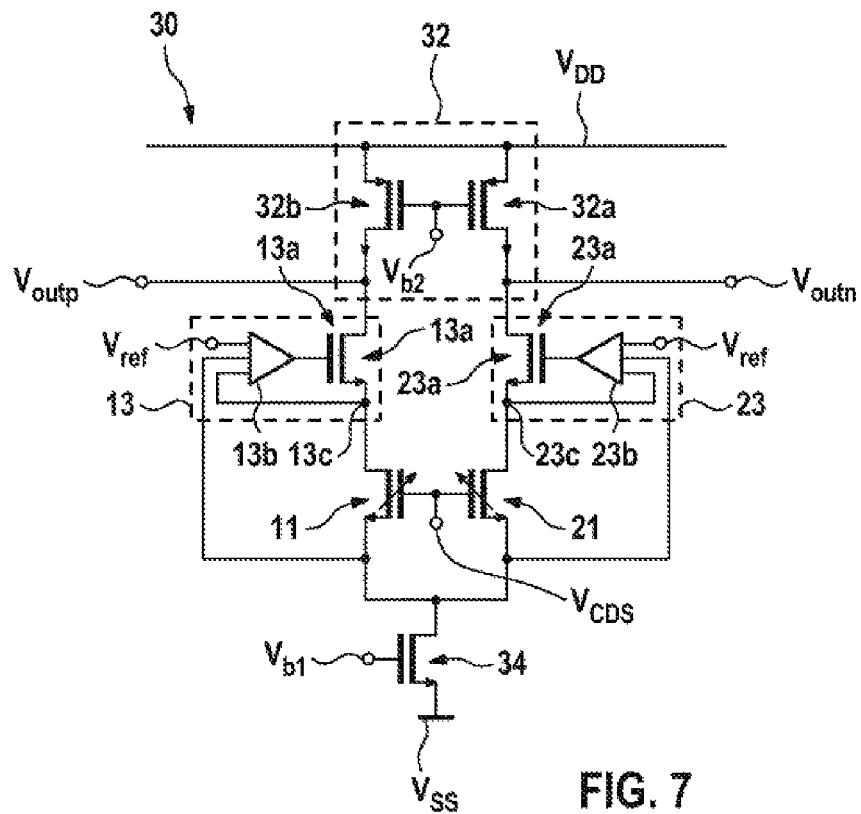
FIG. 7 shows a schematic illustration of a fully differential analysis circuit for two field effect transistors having a movable gate structure in accordance with a further embodiment of the disclosure.

FIG. 7 shows a schematic illustration of a fully differential analysis circuit 30 for two field effect transistors (FET) 11 and 21 having a movable gate structure. A transistor 34 serves as a constant-current source and is connected to a reference potential $V_{SS}$ by a source terminal and is supplied via a first bias voltage $V_{b1}$ at its gate terminal. The transistor 34 can also be embodied as a cascode circuit. The source terminals of the FETs 11 and 21 are coupled to the drain terminal of the bias voltage transistor 34, said FETs being supplied with the gate voltage $V_{CDS}$ at their gate terminals. The drain terminals 13c, 23c of the FETs 11 and 21 are coupled to the impedance converter circuits 13 and 23, respectively, which can be constructed similarly to the impedance converter circuits 13 and 23 in FIG. 6. Furthermore, the operational amplifiers 13b and 23b can have further input terminals, which are coupled to the drain terminal of the bias voltage transistor 34. The impedance converter circuits 13 and 23 are respectively connected to transistors 32a and 32b of the measuring circuit 32, which for their part are coupled to the supply voltage terminal $V_{DD}$ of the analysis circuit 30. The transistors 32a and 32b are in each case supplied with a second bias voltage $V_{b2}$ via a gate terminal. Two voltage signals $V_{outp}$ and $V_{outn}$ can be tapped off at two measurement terminals of the measuring circuit 32, said voltage signals providing a differential measurement signal dependent on the changes in current intensity of the current flowing through the channel regions of the FETs 11 and 21, respectively, said changes being caused by the deflections of the movable gate structures of the FETs 11 and 21, respectively.

Common-mode interference can be effectively suppressed with the aid of the fully differential analysis circuit 30. It goes without saying that the exemplary configurations of the measuring circuits 12 and of the impedance converter circuits 13 in FIGS. 1 to 5 can likewise be used in the differential analysis circuits in FIGS. 6 and 7.

Figure 8:
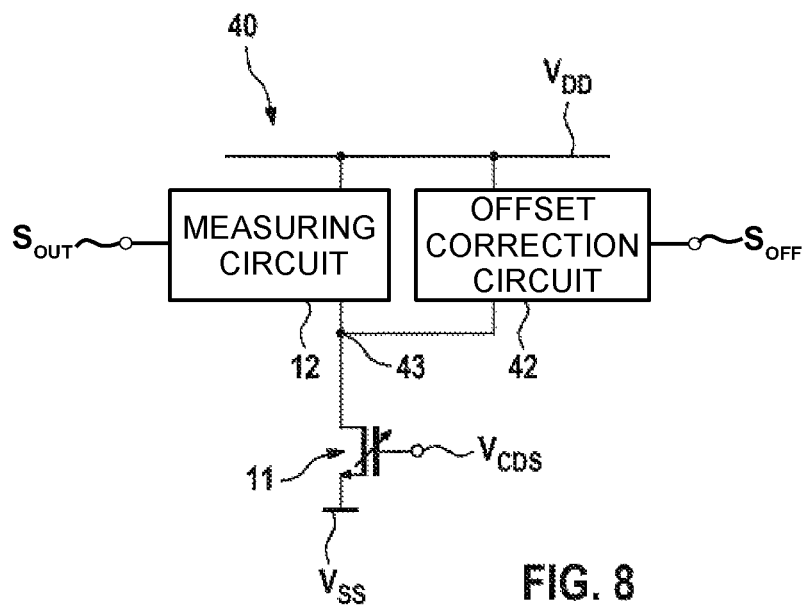
FIGS. 8 to 11 show schematic illustrations of analysis circuits for a field effect transistor having a movable gate structure in accordance with further embodiments of the disclosure.
Figure 9:
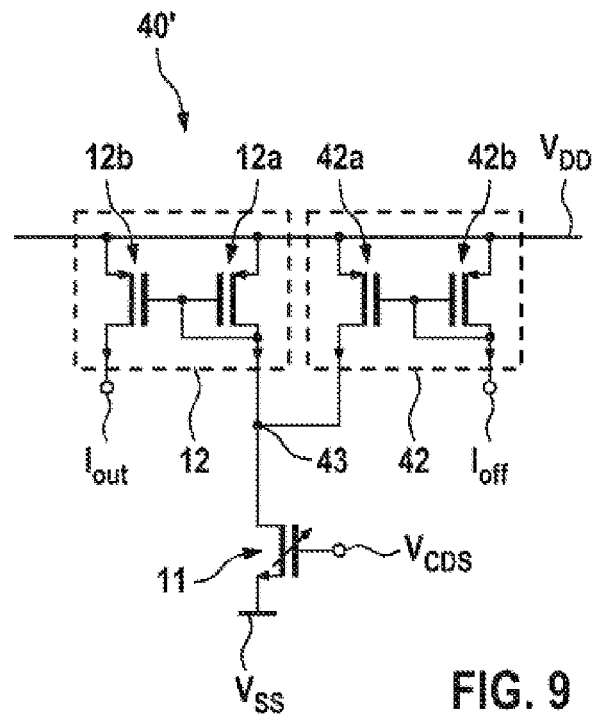
Figure 10:
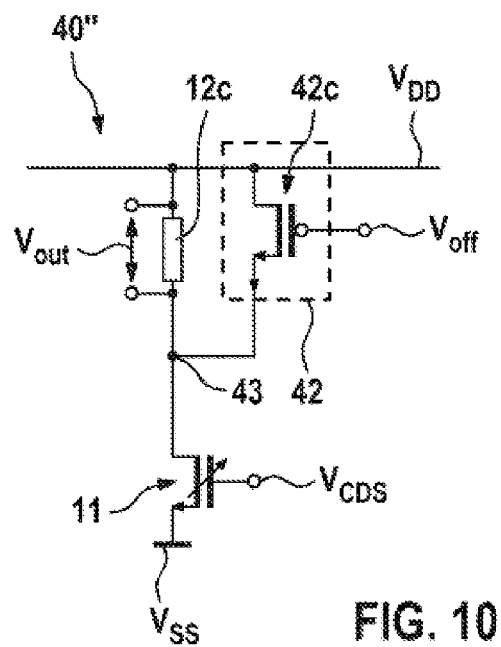
Figure 11:
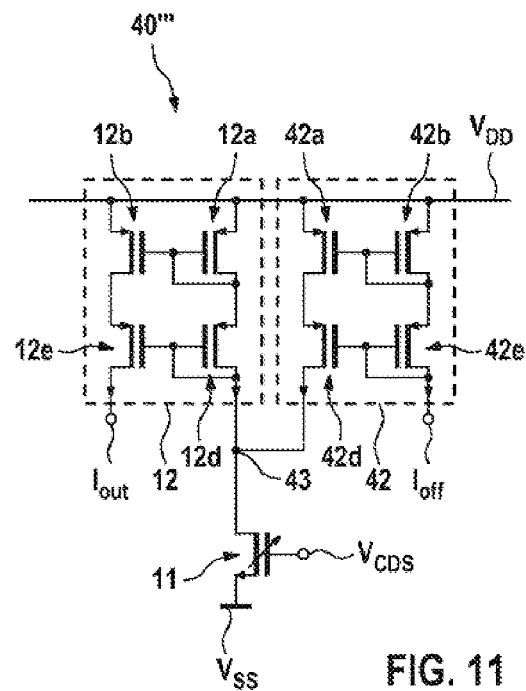

FIG. 8 shows a schematic illustration of an analysis circuit 40 for a field effect transistor (FET) 11 having a movable gate structure. The analysis circuit 40 comprises a FET 11, a measuring circuit 12 having a measurement terminal Sout, and an offset correction circuit 42 having an offset signal feed terminal Soff, said offset correction circuit being designed to carry away a basic current that flows through the channel region of the FET 11 at the drain terminal 43 of the FET 11. The current that flows through the drain terminal of the FET 11 is composed of a basic current and a measurement current. The basic current is that current which flows through the channel region of the FET 11 independently of a deflection of the movable gate structure. The current intensity of the basic current can be in the range of a few microamperes, for example. The measurement current, by contrast, is that portion which is caused by the movement of the movable gate structures, and is of interest for the formation of the measurement signal in the measuring circuit 12. As a result of the basic current being conducted away or a counter-current that cancels the basic current being impressed by the offset correction circuit 42 at the drain terminal 43 of the FET 11, the measuring circuit 12 is only supplied with the measurement current, such that the amplification of the measurement current, which can have a current intensity in a range of pico- to nanoamperes, can be chosen to be significantly higher, without overloading the analysis circuit 40. Furthermore, the signal-to-noise ratio of the measuring circuit 12 is considerably improved as a result. FIGS. 9 to 11 show exemplary embodiments of the analysis circuit 40 shown in FIG. 8.

FIG. 9 shows a schematic illustration of an analysis circuit 40' for a field effect transistor (FET) 11 having a movable gate structure. The analysis circuit 40' differs from the analysis circuit 1 in that an offset correction circuit 42 is coupled between the drain terminal 43 of the FET 11 and the measuring circuit 12. The offset correction circuit 42 can have for example a current mirror circuit composed of two transistors 42a and 42b, via which an offset correction current $I_{off}$ can be impressed into the drain terminal 43 of the FET 11. The offset correction current $I_{off}$ can preferably be chosen such that it precisely cancels the basic current that flows through the channel region of the FET 11.

FIG. 10 shows a schematic illustration of an analysis circuit 40" for a field effect transistor (FET) 11 having a movable gate structure. The analysis circuit 40" differs from the analysis circuit 40' in that the measuring circuit 12 comprises a shunt resistor 12c, at which a voltage signal $V_{out}$ can be tapped off, said voltage signal being dependent on the current intensity of the current flowing through the shunt resistor 12c. Furthermore, the offset correction circuit 42 comprises a p-channel MOSFET 42c, which can be supplied with a variable offset voltage $V_{off}$ at a gate terminal.

FIG. 11 shows a schematic illustration of an evaluation circuit 40''' for a field effect transistor (FET) 11 having movable structure. The analysis circuit 40''' differs from the analysis circuit 40' in that the measuring circuit 12 and the offset correction circuit 42 in each case comprise a cascode circuit composed of four transistors 12a, 12b, 12d and 12e, and respectively 42a, 42b, 42d and 42e. In this case, the cascode circuits can be a serial interconnection of the two current mirror circuits as shown in FIG. 1 and FIG. 9. The use of a cascode circuit makes it possible to improve the linearity of the measurement signal and the amplification of the analysis circuit by comparison with simple current mirror circuits. Alternatively, instead of cascode circuits, it is also possible to use active current mirror circuits for the measuring circuit 12 and the offset correction circuit 42.

Figure 12:
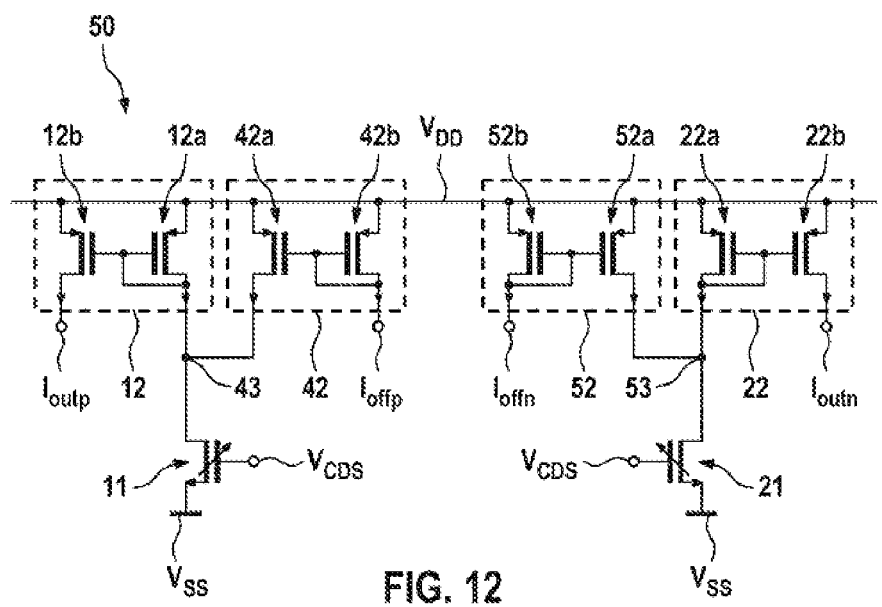
FIG. 12 shows a schematic illustration of pseudo-differential analysis circuit for two field effect transistors having a movable gate structure in accordance with a further embodiment of the disclosure.

FIG. 12 shows a schematic illustration of an analysis circuit 50 for two field effect transistors (FET) 11 and 21 each having a movable gate structure. The analysis circuit 50 is a pseudo-differential analysis circuit composed of two analysis circuits 40' such as are shown in FIG. 9 and have been explained. In this case, the measuring and offset correction circuits of one analysis path, said circuits being designated by the reference signs 22 and 52, correspond to the measuring and offset correction circuits of the other analysis path, said circuits being designated by the reference signs 12 and 42. In this case, two offset correction current signals $I_{offp}$ and $I_{offn}$ can be applied to the offset correction circuits 42 and 52 independently of one another in order to be able to compensate for process-dictated variations in the FETs 11 and 21. In this case, the movable gate structures of the FETs 11 and 21 can be arranged in such a way that the movable gate structures move in opposite directions under the influence of an external force, for example an external acceleration, such that common-mode interference signals, for example as a result of the supply voltage, can be suppressed. In this case, current intensity signals $I_{outp}$ and $I_{outn}$ can be read out at the two output terminals of the measuring circuits 12 and 22, respectively, the difference between which signals can correspond to the measurement signal. By means of the pseudo-differential design of the analysis circuit 50, a digitization of the measurement signal can be simplified and changes in the basic current, for example as a result of changes in the surface charges in the channel regions of the FETs 11 and 21 as a result of ageing influences and/or temperature influences, can be determined and compensated for since such influences are manifested only in common-mode signals and can thus be distinguished from the differential measurement signal.

Figure 13:
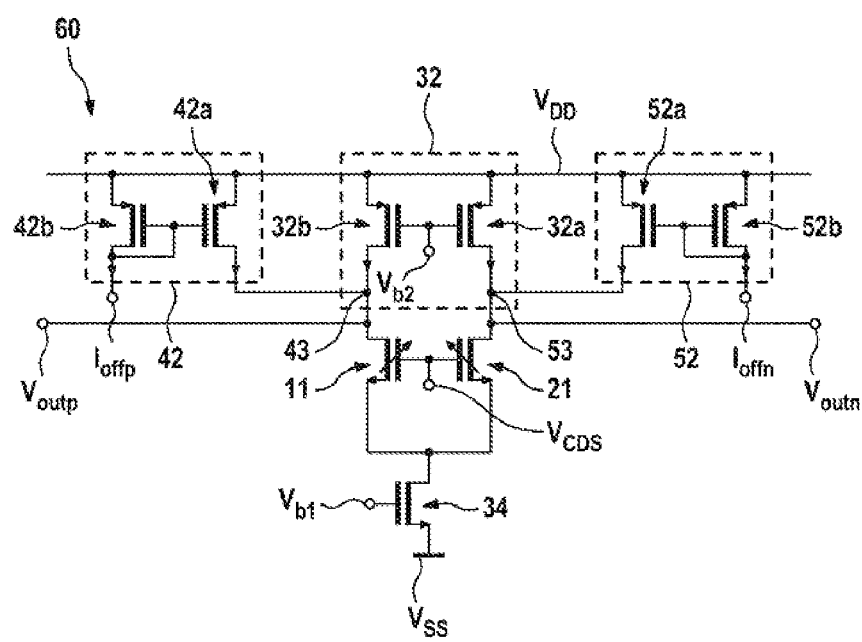
FIG. 13 shows a schematic illustration of a fully differential analysis circuit for two field effect transistors having a movable gate structure in accordance with a further embodiment of the disclosure.

FIG. 13 shows a schematic illustration of a fully differential analysis circuit 60 for two field effect transistors (FET) 11 and 21 having a movable gate structure. In this case, the measuring circuit 32 and the bias voltage transistor 34 correspond to the components of the analysis circuit 30 as shown in FIG. 7, while the offset correction circuits 42 and 52 correspond to the corresponding offset correction circuits in FIG. 12.

Common-mode interference can be effectively suppressed with the aid of the fully differential analysis circuit 60. It goes without saying that the exemplary configurations of the measuring circuits 12 and of the offset correction circuits 42 in FIGS. 1 to 11 can likewise be used in the differential analysis circuits in FIGS. 12 and 13.

The analysis circuits shown in FIGS. 1 to 13 can be used in each case with the corresponding FETs in micromechanical sensors, for example in acceleration sensors, rate-of-rotation sensors, pressure sensors or similar sensors.

The invention claimed is:

1. An analysis circuit for a field effect transistor having a movable gate structure, comprising:
    a supply voltage terminal;
    a measuring circuit coupled between the supply voltage terminal and a drain terminal of the field effect transistor, the measuring circuit being configured to output a measurement signal at a measurement terminal, said measurement signal being dependent on a current intensity of a current flowing through the field effect transistor; and
    an impedance converter circuit having a reference voltage terminal, said impedance converter circuit being coupled between the measuring circuit and the drain terminal of the field effect transistor and being configured to hold the drain terminal of the field effect transistor at a potential of a reference voltage applied to the reference voltage terminal, the impedance converter circuit comprising:
        a source follower transistor, which is coupled between the measuring circuit and the drain terminal of the field effect transistor; and
        an operational amplifier having (i) an output terminal, which is coupled to a gate terminal of the source follower transistor, (ii) an inverting input terminal, which is coupled to the drain terminal of the field effect transistor, and (iii) a non-inverting input terminal, which is coupled to the reference voltage terminal.

2. The analysis circuit as claimed in claim 1, wherein the measuring circuit comprises (i) a current mirror circuit having two input terminals, which are in each case connected to the supply voltage terminal, (ii) a first output terminal, which is coupled to the drain terminal of the field effect transistor, and (iii) a second output terminal, which is coupled to the measurement terminal.

3. The analysis circuit as claimed in claim 1, wherein:
    the measuring circuit has a shunt resistor, and
    the measurement signal comprises a voltage dropped across the shunt resistor.

4. The analysis circuit as claimed in claim 1, wherein the measuring circuit comprises (i) a cascode circuit having two input terminals, which are in each case connected to the supply voltage terminal, (ii) a first output terminal, which is connected to the drain terminal of the field effect transistor, and (iii) a second output terminal, which is coupled to the measurement terminal.

5. The analysis circuit as claimed in claim 1, further comprising:
    an offset correction circuit having an offset signal feed terminal, said offset correction circuit being coupled between the supply voltage terminal and the drain terminal of the field effect transistor and being configured to compensate for a basic current occurring at the drain terminal of the field effect transistor by an offset correction signal fed in at the offset signal feed terminal.

6. The analysis circuit as claimed in claim 5, wherein the offset correction circuit further comprises:
a current mirror circuit or a cascode circuit having (i) two input terminals, which are in each case connected to the supply voltage terminal, (ii) a first output terminal, which is coupled to the drain terminal of the field effect transistor, and (iii) a second output terminal, which is coupled to the offset signal feed terminal.

7. A micromechanical sensor, comprising:
a first field effect transistor having (i) a first movable gate structure, (ii) a first source terminal, which is coupled to a reference potential, (iii) a first drain terminal, and (iv) a first gate terminal, to which a first constant gate voltage is applied; and
a first analysis circuit for the first field effect transistor, the first analysis circuit comprising:
  a first supply voltage terminal and a first measuring circuit coupled between the first supply voltage terminal and the first drain terminal of the first field effect transistor, the first measuring circuit being configured to output a first measurement signal at a first measurement terminal, said first measurement signal being dependent on a current intensity of a current flowing through the first field effect transistor; and
  an impedance converter circuit having a reference voltage terminal, said impedance converter circuit being coupled between the first measuring circuit and the first drain terminal of the first field effect transistor and being configured to hold the drain terminal of the first field effect transistor at a potential of a reference voltage applied to the reference voltage terminal, the impedance converter circuit comprising:
    a source follower transistor, which is coupled between the measuring circuit and the drain terminal of the field effect transistor; and
    an operational amplifier having (i) an output terminal, which is coupled to a gate terminal of the source follower transistor, (ii) an inverting input terminal, which is coupled to the drain terminal of the field effect transistor, and (iii) a non-inverting input terminal, which is coupled to the reference voltage terminal.

8. The micromechanical sensor as claimed in claim 7, further comprising:
a second field effect transistor having (i) a second movable gate structure, (ii) a second source terminal, which is coupled to the reference potential, (iii) a second drain terminal, and (iv) a second gate terminal, to which a second constant gate voltage is applied; and
a second analysis circuit for the second field effect transistor, the second analysis circuit including a second supply voltage terminal and a second measuring circuit coupled between the second supply voltage terminal and the second drain terminal of the second field effect transistor, the second measuring circuit being configured to output a second measurement signal at a second measurement terminal, said second measurement signal being dependent on a current intensity of a current flowing through the second field effect transistor,
wherein the first movable gate structure of the first field effect transistor is movable in an opposite direction with respect to the second movable gate structure of the second field effect transistor under an influence of an external force acting on the micromechanical sensor.

* * * * *